United States Patent
Kim et al.

(10) Patent No.: US 11,082,068 B2
(45) Date of Patent: Aug. 3, 2021

(54) ERROR CORRECTION CIRCUIT, MEMORY CONTROLLER HAVING ERROR CORRECTION CIRCUIT, AND MEMORY SYSTEM HAVING MEMORY CONTROLLER

(71) Applicant: SK hynix Inc., Icheon-si (KR)

(72) Inventors: Dae Sung Kim, Icheon-si (KR); Kwang Hyun Kim, Yongin-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/694,987

(22) Filed: Nov. 25, 2019

(65) Prior Publication Data

US 2021/0036719 A1 Feb. 4, 2021

(30) Foreign Application Priority Data

Jul. 31, 2019 (KR) .................. 10-2019-0093392

(51) Int. Cl.
*H03M 13/15* (2006.01)
*G06F 11/10* (2006.01)

(52) U.S. Cl.
CPC ....... *H03M 13/152* (2013.01); *G06F 11/1076* (2013.01)

(58) Field of Classification Search
CPC .................................................. H03M 13/152
USPC ................... 714/764, 762, 767, 765, 770
See application file for complete search history.

(56) References Cited

U.S. PATENT DOCUMENTS

| | | | | |
|---|---|---|---|---|
| 10,707,899 B2* | 7/2020 | Bhatia | ................ | H03M 13/1174 |
| 2003/0106009 A1* | 6/2003 | Jarchi | ................ | H03M 13/152 |
| | | | | 714/755 |
| 2005/0251723 A1 | 11/2005 | Ilani | | |
| 2011/0289380 A1 | 11/2011 | Wilkerson et al. | | |
| 2012/0066563 A1 | 3/2012 | Obata et al. | | |
| 2015/0256199 A1 | 9/2015 | Yen et al. | | |
| 2015/0311920 A1* | 10/2015 | Wang | ................ | H03M 13/6502 |
| | | | | 714/764 |
| 2016/0179620 A1* | 6/2016 | Bazarsky | .......... | H03M 13/3707 |
| | | | | 714/766 |

(Continued)

FOREIGN PATENT DOCUMENTS

| | | |
|---|---|---|
| KR | 10-1188002 | 10/2012 |
| KR | 10-1394596 | 5/2014 |

(Continued)

*Primary Examiner* — Fritz Alphonse
(74) *Attorney, Agent, or Firm* — Perkins Coie LLP

(57) ABSTRACT

An error correction circuit using a BCH code may include a decoder performing at least one of a first error correction decoding using a first error correction capability or a second error correction decoding using a second error correction capability and an encoder generating a codeword based on a message and a generation matrix corresponding to the first error correction capability and generating an additional parity based on the codeword and one or more rows of a parity check matrix corresponding to the second error correction capability, wherein a syndrome vector generated based on a read vector corresponding to the codeword is used during the first error correction decoding and an additional syndrome generated based on the additional parity is used during the second error correction decoding, and wherein the one or more rows are extended from a parity check matrix corresponding to the first error correction capability.

20 Claims, 13 Drawing Sheets

(56) References Cited

U.S. PATENT DOCUMENTS

2017/0070239 A1    3/2017  Hung
2020/0366317 A1*  11/2020  Myung ................ H04L 1/0065

FOREIGN PATENT DOCUMENTS

| KR | 10-2017-0014610 | 2/2017 |
| KR | 10-2018-0027803 | 3/2018 |
| KR | 10-2020-0099438 | 8/2020 |

* cited by examiner

FIG. 1

$$\begin{array}{c}
H2 \\
\overbrace{H1} \\
\begin{array}{cccccccc}
1 & \alpha & \alpha^2 & \alpha^3 & \cdots & \alpha^{n-1} \\
1 & \alpha^2 & (\alpha^2)^2 & (\alpha^2)^3 & \cdots & (\alpha^2)^{n-1} \\
1 & \alpha^3 & (\alpha^3)^2 & (\alpha^3)^3 & \cdots & (\alpha^3)^{n-1} \\
\vdots & \vdots & \vdots & \vdots & \cdots & \vdots \\
1 & \alpha^{2t} & (\alpha^{2t})^2 & (\alpha^{2t})^3 & \cdots & (\alpha^{2t})^{n-1} \\
\end{array}
\quad
\begin{array}{ccccc}
1 & \alpha^{2t+1} & (\alpha^{2t+1})^2 & (\alpha^{2t+1})^3 & \cdots & (\alpha^{2t+1})^{n-1} \\
\vdots & \vdots & \vdots & \vdots & \cdots & \vdots \\
1 & \alpha^{2t+\beta} & (\alpha^{2t+\beta})^2 & (\alpha^{2t+\beta})^3 & \cdots & (\alpha^{2t+\beta})^{n-1} \\
\end{array}
\text{Extended rows}
\end{array}$$

$H2 = \begin{array}{|c|c|} \hline H1 & \text{Extended rows} \\ \hline \end{array}$ with widths $2t$ and $\beta$, height $n$

ERROR CORRECTION CIRCUIT, MEMORY CONTROLLER HAVING ERROR CORRECTION CIRCUIT, AND MEMORY SYSTEM HAVING MEMORY CONTROLLER

CROSS-REFERENCE TO RELATED APPLICATION

This patent document claims priority to and benefits of the Korean patent application number 10-2019-0093392, filed on Jul. 31, 2019, which is incorporated herein by reference in its entirety.

TECHNICAL FIELD

The disclosed technology generally relates to an error correction circuit, a memory controller having the error correction circuit and a memory system having the memory controller.

BACKGROUND

A memory system may include a storage medium in which data is stored temporarily or permanently. Data errors or data corruption may occur during various operations such as writing, reading, transmission, or processing. To ensure data reliability, a memory system uses error correction techniques such as error correction encoding and error correction decoding.

SUMMARY

Various embodiments are directed to an error correction circuit capable of varying error correction capability. Some implementations of the disclose technology provide a memory controller and a memory system that employ the error correction circuit.

According to an embodiment, an error correction circuit using a Bose-Chaudhuri-Hocquenghem (BCH) code may include a decoder configured to perform at least one of a first error correction decoding using a first error correction capability or a second error correction decoding using a second error correction capability, and an encoder configured to generate a codeword based on a message and a first generation matrix corresponding to the first error correction capability and to generate a first additional parity based on the codeword and one or more rows of a second parity check matrix corresponding to the second error correction capability, wherein a first syndrome vector generated based on a read vector corresponding to the codeword is used during the first error correction decoding and an additional syndrome generated based on the first additional parity is used during the second error correction decoding, and wherein the one or more rows are extended from the a parity check matrix corresponding to the first error correction capability.

According to an embodiment, a memory controller using a Bose-Chaudhuri-Hocquenghem (BCH) code may include a decoder configured to perform at least one of a first error correction decoding using a first error correction capability or a second error correction decoding using a second error correction capability, and an encoder configured to generate a codeword based on a message and a first generation matrix and to generate a first additional parity based on the codeword and one or more rows of a second parity check matrix, the first generation matrix and the second parity check matrix related to the first error correction capability and the second error correction capability, respectively, wherein a first syndrome vector that is generated based on a read vector corresponding to the codeword is used during the first error correction decoding and an additional syndrome generated based on the first additional parity is used during the second error correction decoding, and wherein the one or more rows are extended from a first parity check matrix corresponding to the first error correction capability.

According to an embodiment, a memory system using a Bose-Chaudhuri-Hocquenghem (BCH) code may include a memory controller configured to generate a codeword by using a message and a first generation matrix corresponding to a first parity check matrix, generate a first additional parity based on the codeword and one or more rows of a second parity check matrix, and generate a sub-codeword by using the first additional parity and a third generation matrix, the first generation matrix and the second parity check matrix corresponding to a first error correction capability and a second error correction capability, respectively, and a memory device in communication with the memory controller and configured to receive the codeword and the sub-codeword from the memory controller and storing the codeword and the sub-codeword in a first storage area and in a second storage area, respectively, wherein the one or more rows are extended from the first parity check matrix.

BRIEF DESCRIPTION OF THE DRAWINGS

FIG. 1 is a diagram illustrating an example of parity check matrices of a Bose-Chaudhuri-Hocquenghem (BCH) code according to an embodiment of the disclosed technology.

DETAILED DESCRIPTION

Figure 2:
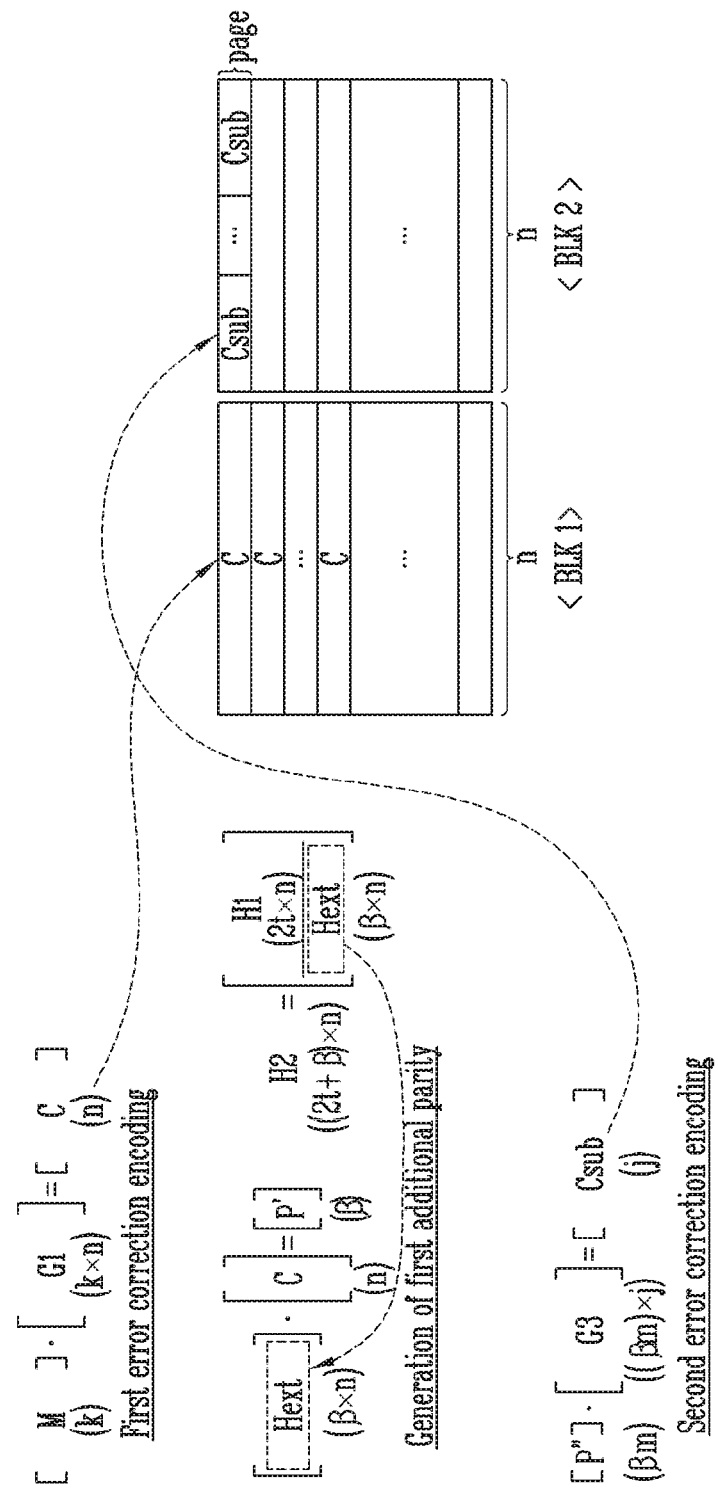
FIG. 2 is a diagram illustrating an example of error correction encoding according to an embodiment of the disclosed technology.

The specific structural or functional description disclosed herein is merely illustrative for the purpose of describing embodiments. The embodiments according to the concept of the present disclosure can be implemented in various forms, and cannot be construed as limited to the embodiments set forth herein.

A Bose-Chaudhuri-Hocquenghem (BCH) code has a predetermined error correction capability. Error correction decoding of the BCH code is performed using a syndrome vector. A length of the syndrome vector determines an error correction capability of the BCH code. A syndrome vector may be generated as a product of a parity check matrix and a read vector corresponding to a codeword. A length of the syndrome vector may be determined by a size of the parity check matrix. Thus, the length of the syndrome vector is fixed when the parity check matrix is determined.

When an additional syndrome is used during the error correction decoding of the BCH code, error correction capability of an error correction circuit may be increased.

In some embodiments of the disclosed technology, the parity check matrix of the BCH code may extend to have an additional row(s), and an additional parity may be generated based on extended rows. The additional parity may be used to generate the additional syndrome. The additional syndrome allows the error correction circuit to perform error correction decoding with higher error correction capability.

In some embodiments of the disclosed technology, the error correction circuit may vary the error correction capability depending on the usage of the additional syndrome during error correction decoding. For example, the error correction circuit may perform error correction decoding with a first error correction capability without using the additional syndrome, or with a second correction capability by using the additional syndrome. The second correction capability is greater than the first error correction capability.

FIG. 1 is a diagram illustrating an example of parity check matrices of a Bose-Chaudhuri-Hocquenghem (BCH) code according to an embodiment of the disclosed technology.

When the BCH code has a length of n, when n equals to '$2^m-1$' and m and n are natural numbers, a parity check matrix of the BCH code may include elements pertaining to the Galois field $GF(2^m)$. $GF(2^m)$ is a finite field consisting of $2^m$ elements which may be expressed as $\{0, \alpha^0, \alpha^1, \ldots, \alpha^{2^m-2}\}$.

When the length of the BCH code is set and the error correction capability of the error correction circuit is determined, the size of the parity check matrix of the BCH code may be determined.

When the length of the BCH code is set as 'n' and the error correction capability of the error correction circuit is determined as 't' (here, 't' is a natural number), the parity check matrix corresponding to the error correction capability 't' may have a size of '2t×n.' Hereinafter, the error correction capability 't' is referred to as a 'first error correction capability' and the parity check matrix corresponding to the first error correction capability may be referred to as a 'first parity check matrix H1.'

The parity check matrix of the BCH code may be generated or extended according to predetermined rules. By extending the first parity check matrix 'H1' to have an additional row(s), a second parity check matrix 'H2' may be generated. The second parity check matrix 'H2' may have a second error correction capability greater than the first error correction capability. When there are 'β' extended rows, the second parity check matrix 'H2' has a size of '(2t+β)×n.' 'β' is a natural number and determined depending on the second correction capability.

FIG. 2 is a diagram illustrating an example of error correction encoding according to an embodiment of the disclosed technology.

Error correction encoding according to an embodiment of the disclosed technology may include first error correction encoding, generation of first additional parity and second error correction encoding.

During the first error correction encoding, a codeword 'C' may be generated based on a message M and a first generation matrix 'G1' corresponding to the first parity check matrix 'H1.' For example, when the message M consisting of k bits and the first generation matrix 'G1' having a size of 'k×n' are used, the codeword 'C' consisting of n bits may be generated.

During generation of first additional parity, a first additional parity 'P'' may be generated based on some rows of the second parity check matrix 'H2' and the codeword 'C' generated during the first error correction encoding. For example, the first additional parity 'P'' can be generated based on the extended rows 'Hext' extended from the first parity check matrix 'H1.' For example, when the extended rows 'Hext' having a size of 'β×n' and the codeword 'C' consisting of the n bits are used, the first additional parity 'P'' consisting of 'β' elements may be generated. Since the extended rows 'Hext' used to generate the first additional parity 'P'' do not correspond to the first generation matrix 'G1' used to generate the codeword 'C,' the first additional parity 'P'' may include an element which is not zero. The first additional parity 'P'' including the element which is not zero may be used to generate an additional syndrome during error correction decoding.

During second error correction encoding, a sub-codeword 'Csub' may be generated based on the first additional parity 'P'' and a third generation matrix 'G3.' Since the first additional parity 'P'' consists of the elements pertaining to $GF(2^m)$, the elements included in the first additional parity 'P'' need to be converted into binary elements to generate the sub-codeword 'Csub.' When the elements of $GF(2^m)$ are converted into the binary elements, the converted binary elements may have a length of m bits. Therefore, the first additional parity 'P'' consisting of the β elements of $GF(2^m)$ may be converted into a first additional parity 'P''' consisting of βm binary elements. The third generation matrix 'G3' may have a size of βm×j, where j is a natural number which is equal to or greater than βm. In addition, 'j' may be determined in consideration of error correction capability with respect to the sub-codeword 'Csub.'

When the error correction circuit is applied to a memory system, the codeword 'C' and the sub-codeword 'Csub' corresponding to the codeword 'C' may be stored in different storage areas. For example, a storage area may be a memory block, a page or a chunk. The codeword 'C' and the sub-codeword 'Csub' may be stored in different memory blocks, different pages of the same memory block, or different chunks of the same page. FIG. 2 shows an example in which the codeword 'C' is stored in a first memory block 'BLK 1' and the sub-codeword 'Csub' corresponding to the codeword 'C' may be stored in a second memory block 'BLK 2.'

A partial program method, which is to be explained below, can be used to store the sub-codeword 'Csub.'.

By the partial program method, data may be stored in a portion of one page (or a chunk). For example, the memory system may divide a page into a plurality of program units based on a predetermined number of partial program (NOP). For example, when a page has a length of n bits, the memory system may set the NOP to n/βm in advance. Thus, the memory system may set βm bits as the program unit.

When the partial program method is used, the memory system may store the sub-codeword 'Csub' in one program unit whenever the sub-codeword 'Csub' corresponding to one codeword 'C' is generated.

Figure 3:
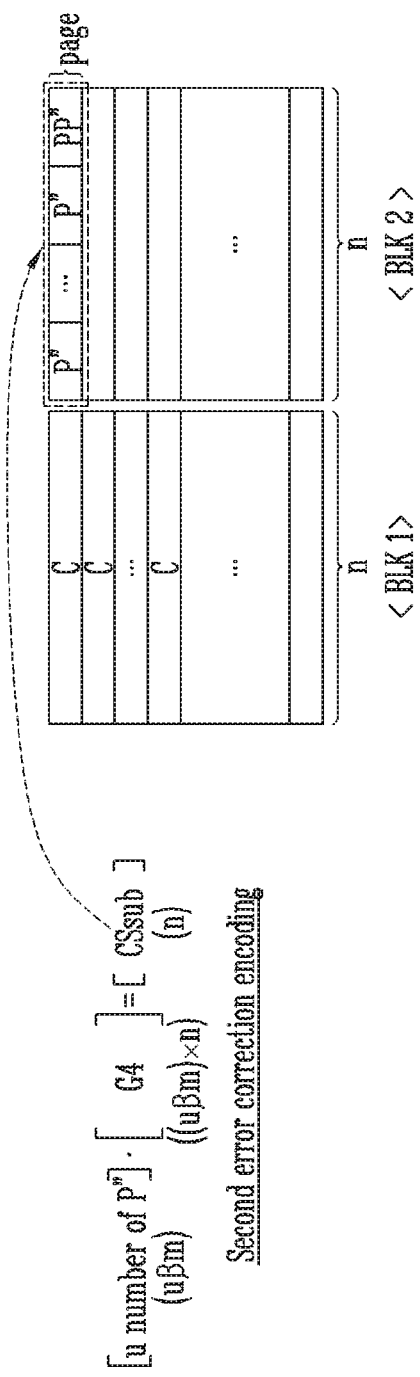
FIG. 3 is a diagram illustrating another example of second error correction encoding.

FIG. 3 is a diagram illustrating another example of second error correction encoding.

In the example described with reference to FIG. 2, the sub-codeword 'Csub' may be generated based on one first additional parity 'P''' corresponding to a codeword 'C.'

According to an embodiment, a sub-codeword 'CSsub' may be generated based on a plurality of first additional parity 'P''' corresponding to a plurality of codewords 'C.' For example, second error correction encoding may be performed based on u first additional parities 'P''' corresponding to u codewords and a fourth generation matrix 'G4' having a size of 'uβm×w,' so that the sub-codeword 'CSsub' having a length of 'w' bits may be generated. Herein, 'u' may be a natural number of 2 or more and 'w' may be a natural number between 2 and n.

FIG. 3 shows an example in which 'w' is 'n.' In FIG. 3, the second error correction encoding is performed based on the u first additional parities 'P''' corresponding to the u codewords and the fourth generation matrix 'G4' having the size of 'uβm×w,' so that the sub-codeword 'CSsub' having the length of n bits is generated. The sub-codeword 'CSsub' may include the u first additional parities 'P''' and parities 'PP''' corresponding to the u first additional parities 'P'''.'

In the same manner as described with reference to FIG. 2, the plurality of codewords 'C' and the sub-codewords 'CSsub' corresponding to the plurality of codewords 'C' may be stored in different storage areas.

Figure 4:
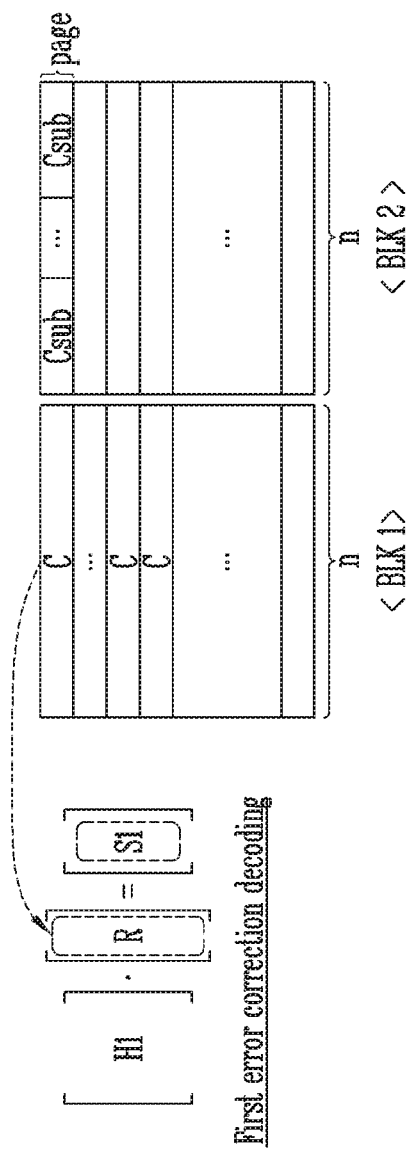
FIG. 4 is a diagram illustrating an example of first error correction decoding according to an embodiment of the disclosed technology.

FIG. 4 is a diagram illustrating an example of first error correction decoding according to an embodiment of the disclosed technology.

The first error correction decoding may be performed using a first error correction capability.

When the error correction circuit is applied to the memory system, the storage area storing the codeword 'C' may be accessed and a read vector 'I' corresponding to the codeword 'C' may be obtained. FIG. 4 shows an example in which a page of the memory block 'BLK 1' is accessed and the read vector 'R' corresponding to the codeword 'C' is acquired.

The first error correction decoding may be performed based on the first parity check matrix 'H1' corresponding to the first error correction capability and the read vector 'R' corresponding to the codeword 'C.' The first error correction decoding may be performed through syndrome check, error location polynomial generation, error location search and error correction. The syndrome check may include a first syndrome check and a second syndrome check. The first syndrome check may be performed based on the read vector 'R' and the first parity check matrix 'H1.' When the first syndrome check fails, error location polynomial generation, error location search and error correction may be performed based on a first syndrome vector 'S1' generated during the first syndrome check, and the second syndrome check may be performed based on an error-corrected read vector 'R'' and the first parity check matrix 'H1.' When the first error correction decoding has been successful and thus passes, e.g., when the first syndrome check or the second syndrome check have been successful pass, the decoded codeword may be output. When the second syndrome check fails, it may mean that the first error correction decoding has failed. When the first error correction decoding fails, second error correction decoding using a second error correction capability may be performed. The first syndrome vector 'S1' generated during the first syndrome check may be used to generate an additional syndrome during the second error correction decoding, which will be described below with the accompanying drawings.

Figure 5:
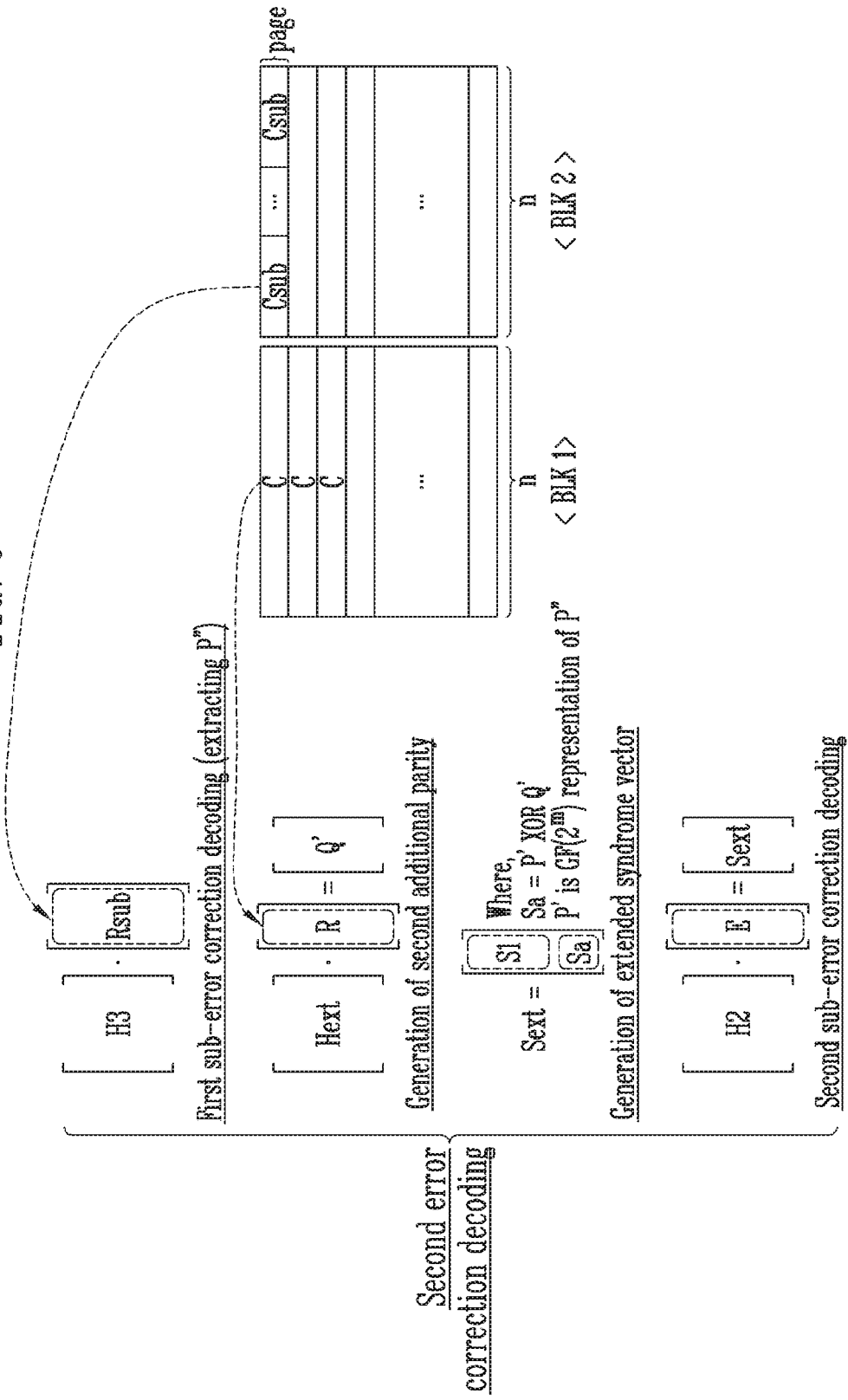
FIG. 5 is a diagram illustrating an example of second error correction decoding according to an embodiment of the disclosed technology.

FIG. 5 is a diagram illustrating an example of second error correction decoding according to an embodiment of the disclosed technology.

When the first error correction decoding fails, second error correction decoding using a second error correction capability may be performed.

When the error correction circuit is applied to the memory system, a storage area in which the sub-codeword 'Csub' or 'CSsub' corresponding to the codeword 'C' may be additionally accessed, and a read vector 'Rsub' corresponding to the sub-codeword 'Csub' or 'CSsub' may be acquired.

FIG. 5 shows an example in which a page of the memory block 'BLK 2,' other than the memory block 'BLK 1' storing the codeword 'C,' is additionally accessed and the read vector 'Rsub' corresponding to the sub-codeword 'Csub' is obtained.

The second error correction decoding may include first sub-error correction decoding, generation of a second additional parity, generation of an extended syndrome vector and second sub-error correction decoding.

During first sub-error correction decoding, a third parity check matrix 'H3' corresponding to the third generation matrix 'G3' and the read vector 'Rsub' corresponding to the sub-codeword 'Csub' may be used. The first sub-error correction decoding may be performed through syndrome check, error location polynomial generation, error location search and error correction. The syndrome check may include a third syndrome check and a fourth syndrome check. The third syndrome check may be performed based on the read vector 'Rsub' and the third parity check matrix 'H3.' When the third syndrome check fails, error location polynomial generation, error location search and error correction may be performed based on a third syndrome vector 'S3' generated during the third syndrome check, and the fourth syndrome check may be performed based on the error-corrected read vector 'Rsub'' and the third parity check matrix 'H3.' When the first sub-error correction decoding passes, e.g., when the third syndrome check or the fourth syndrome check passes, the first additional parity 'P''' consisting of βm binary elements may be extracted (or restored). The first additional parity 'P''' consisting of the βm binary elements may be converted into the first additional parity 'P''' consisting of β elements of $GF(2^m)$. When the fourth syndrome check fails, it may mean that the first sub-error correction decoding has failed. When the first sub-error correction decoding fails, the second error correction decoding may finish, and a fail signal indicating that the second error correction decoding has been failed may be output.

During the generation of the second additional parity, a second additional parity 'Q'' may be generated based on the extended rows 'Hext' extending from the first parity check matrix 'H1' and the read vector 'R' corresponding to the codeword 'C.' For example, when the extended rows 'Hext' having a size of 'β×n' and the read vector 'R' consisting of n bits are used, the second additional parity 'Q'' consisting of the β elements of $GF(2^m)$ may be generated.

An extended syndrome vector 'Sext' may be generated by combining an additional syndrome 'Sa' and the first syndrome vector 'S1' generated during the first error correction decoding as described with reference to FIG. 4. The additional syndrome 'Sa' may be a result of performing an exclusive OR (XOR) operation on the first additional parity 'P'' including the elements of $GF(2^m)$ and the second additional parity Q' including the elements of $GF(2^m)$.

During second sub-error correction decoding, error location polynomial generation, error location search and error correction may be performed based on the extended syndrome vector 'Sext.' The read vector 'R' may be a combination of the codeword 'C' and an error vector 'E' and the extended syndrome vector Sext may derive from the error vector 'E.' Therefore, when the extended syndrome vector 'Sext' is used, estimation of the error vector E and error correction may be performed. Thereafter, a fifth syndrome check may be performed based on an error-corrected read vector 'R''' and the second parity check matrix 'H2.' When the fifth syndrome check passes, the decoded codeword may be output. When the fifth syndrome check fails, a fail signal indicating that the second error correction decoding fails may be output. Since a length of the extended syndrome vector 'Sext' corresponds to a size of the second parity check matrix 'H2,' it may be considered that the second sub-error correction decoding is performed with the second error correction capability.

Figure 6:
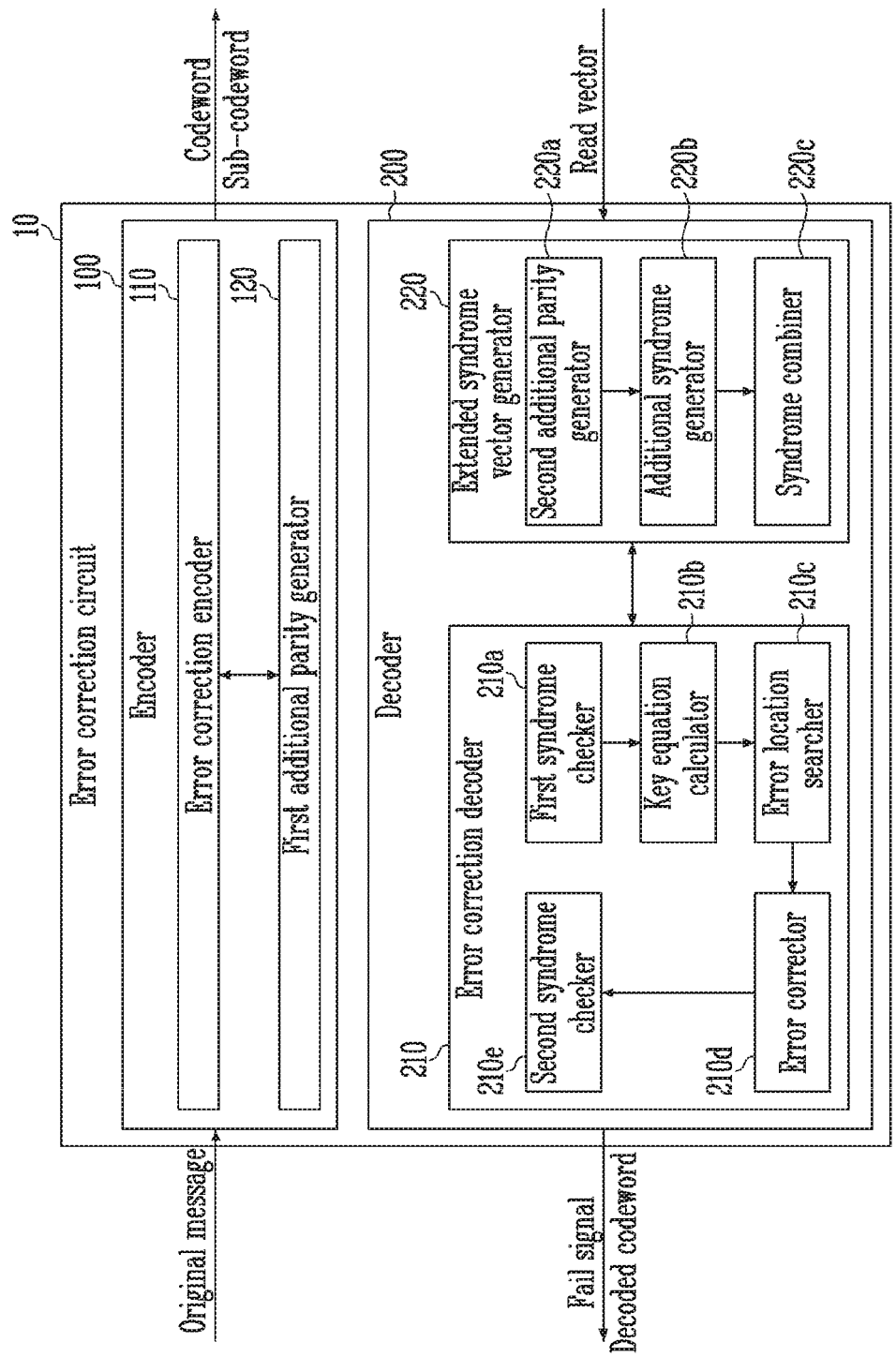
FIG. 6 is a diagram illustrating an example of an error correction circuit according to an embodiment of the disclosed technology.

FIG. 6 is a diagram illustrating an example of an error correction circuit 10 according to an embodiment of the disclosed technology.

Referring to FIG. 6, according to an embodiment of the disclosed technology, the error correction circuit 10 may include an encoder 100 and a decoder 200.

The encoder 100 may perform error correction encoding on an original message and output at least one of a codeword or a sub-codeword to a channel. The encoder 100 may include an error correction encoder 110 and a first additional parity generator 120.

The error correction encoder 110 may perform first error correction encoding based on the first generation matrix 'G1' and the original message to generate the codeword 'C.' For example, the error correction encoder 110 may generate the codeword 'C' having n bits by performing first error correction encoding based on the first generation matrix 'G1' having a size of 'k×n' and the original message having k bits.

The first additional parity generator 120 may generate the first additional parity P' based on the codeword 'C' and the extended rows 'Hext' extended from the first parity check matrix 'H1' corresponding to the first generation matrix 'G1.' For example, the first additional parity generator 120 may generate the first additional parity 'P'' including the β elements of $GF(2^m)$ by performing product of the extended rows 'Hext' having a size of 'β×n' and the codeword 'C' including the n bits.

The error correction encoder 110 may convert the first additional parity 'P'' including the elements of $GF(2^m)$ into the first additional parity 'P''' including binary elements and generate the sub-codeword 'Csub' based on the first additional parity 'P''' and the third generation matrix 'G3.' For example, the error correction encoder 110 may generate the sub-codeword 'Csub' having j bits by performing second error correction encoding based on the first additional parity 'P''' including the binary elements and having a length of 'βm' and the third generation matrix 'G3' having a size of 'βm×j.' In an embodiment, the error correction encoder 110 may generate the sub-codeword 'CSsub' by performing second error correction encoding based on u first additional parities 'P''' corresponding to u codewords and the fourth generation matrix 'G.' Herein, 'u' may be a natural number of 2 or more. When the fourth generation matrix 'G4' has a size of 'uβm×n,' the sub-codeword 'CSsub' including n bits may be generated.

The error correction encoder 110 may output the generated codeword 'C' and the sub-codeword 'Csub' or 'CSsub' to a channel.

The decoder 200 may receive a read vector from the channel. The error correction decoder 210 may perform error correction decoding using at least one of the first error correction capability or the second error correction capability. For example, the decoder 200 may perform first error correction decoding with the first error correction capability by using the read vector 'R' corresponding to the codeword 'C,' or may perform second error correction decoding with the second error correction capability by further using the read vector 'Rsub' corresponding to the sub-codeword 'Csub' or 'CSsub.' According to an embodiment, when the first error correction decoding fails, the decoder 200 may further receive the read vector 'Rsub' corresponding to the sub-codeword 'Csub' or 'CSsub' and perform second error correction decoding by further using the read vector 'Rsub.'

The decoder 200 may include an error correction decoder 210 and an extended syndrome vector generator 220.

The error correction decoder 210 may include a first syndrome checker 210a, a key equation calculator 210b, an error location searcher 210c, an error corrector 210d and a second syndrome checker 210e. The extended syndrome vector generator 220 may include a second additional parity generator 220a, an additional syndrome generator 220b and a syndrome combiner 220c.

<Embodiment in which First Error Correction Decoding is Performed with a First Error Correction Capability>

The first syndrome checker 210a may perform a first syndrome check based on the first parity check matrix H1 corresponding to the first error correction capability and the read vector 'R' corresponding to the codeword 'C.' For example, the first syndrome checker 210a may generate the first syndrome vector 'S1' based on the first parity check matrix H1 and the read vector 'R' and check whether all elements included in the first syndrome vector 'S1' are zero (0). When all elements of the first syndrome vector 'S1' are zero, it may be determined that the first syndrome check has been successful and thus passes. When at least one of the elements of the first syndrome vector is not zero, it may be determined that the first syndrome check fails.

When the first syndrome check passes, the first syndrome checker 210a may output the decoded codeword.

When the first syndrome check fails, the first syndrome checker 210a may provide the first syndrome vector 'S1' to the key equation calculator 210b. The first syndrome checker 210a may further provide the extended syndrome vector generator 220 with the first syndrome vector 'S1.' The first syndrome vector 'S1' provided to the extended syndrome vector generator 220 may be used during the second error correction decoding performed when the first error correction decoding fails. This will be described below in detail.

The key equation calculator 210b may generate an error location polynomial based on the first syndrome vector 'S1' received from the first syndrome checker 210a. When the error location polynomial is generated, a Berlekamp-Massey (BM) algorithm or a Euclidian algorithm may be used. However, embodiments of the disclosed technology are not limited thereto. The key equation calculator 210b may provide the error location searcher 210c with the generated error location polynomial.

The error location searcher 210c may calculate an error location based on the error location polynomial received from the key equation calculator 210b. When the error location is calculated, a Chien search algorithm may be used. However, embodiments of the disclosed technology are not limited thereto. The error location searcher 210c may provide the calculated error location to the error corrector 210d.

The error corrector 210d may perform error correction based on information about the error location received from the error location searcher 210c. For example, when a binary BCH code is used, the error corrector 210d may invert a bit corresponding to an error based on the received information about the error location. For example, when a non-binary BCH code is used, error correction may be performed according to a Forney algorithm.

The error corrector 210d may provide the error-corrected read vector 'R'' to the second syndrome checker 210e.

The second syndrome checker 210e may perform a second syndrome check based on the first parity check matrix H1 and the error-corrected read vector 'R'.' For example, the second syndrome checker 210e may generate a second syndrome vector based on the first parity check matrix 'H1' and the error-corrected read vector 'R'' and check whether all elements included in the second syndrome vector are zero. When all elements of the second syndrome vector are zero, it may be determined that the second syndrome check passes. When at least one of the elements of the second syndrome vector is not zero, it may be determined that the second syndrome check fails.

When the second syndrome check passes, the second syndrome checker 210e may output the decoded codeword.

When the second syndrome check fails, second error correction decoding may be performed with a second error correction capability.

<Embodiment in which Second Error Correction Decoding is Performed with a Second Error Correction Capability>

When the first error correction decoding fails, the error correction decoder 210 may further receive the read vector 'Rsub' corresponding to the sub-codeword 'Csub' or 'CSsub' from a channel.

The error correction decoder 210 may perform first sub-error correction decoding based on the third parity check matrix 'H3' and the read vector 'Rsub' corresponding to the sub-codeword 'Csub,' or based on the read vector 'Rsub' corresponding to the sub-codeword 'CSsub' and a fourth parity check matrix 'H4' corresponding to the fourth generation matrix 'G4.' During the first sub-error correction decoding, the third syndrome check and the fourth syndrome check may be performed.

For example, the first syndrome checker 210a may perform the third syndrome check based on the third parity check matrix 'H3' and the read vector 'Rsub' corresponding to the sub-codeword 'Csub,' or based on the fourth parity check matrix 'H4' and the read vector 'Rsub' corresponding to the sub-codeword 'CSsub.'

When the third syndrome check fails, the first syndrome checker 210a may provide the third syndrome vector 'S3' generated during the third syndrome check to the key equation calculator 210b.

The key equation calculator 210b may generate an error location polynomial based on the third syndrome vector received from the first syndrome checker 210a. The key equation calculator 210b may provide the generated error location polynomial to the error location searcher 210c.

The error location searcher 210c may calculate an error location based on the error location polynomial received from the key equation calculator 210b. The error location searcher 210c may provide the calculated error location to the error corrector 210d.

The error corrector 210d may perform error correction based on information about the error location received from the error location searcher 210c. The error corrector 210d may provide the error-corrected read vector 'Rsub'' to the second syndrome checker 210e.

The second syndrome checker 210e may perform the fourth syndrome check based on the third parity check matrix H3 and the error-corrected read vector 'Rsub',' or based on the fourth parity check matrix H4 and the error-corrected read vector 'Rsub'.'

When the third syndrome check or the fourth syndrome check passes, it may be said that the first sub-error correction decoding passes. When the third syndrome check and the fourth syndrome check fail, it may be said that the first sub-error correction decoding fails.

When the first sub-error correction decoding fails, the second error correction decoder 210 may output a fail signal indicating that the second error correction decoding fails.

When the first sub-error correction decoding passes, the error correction decoder 210 may extract (or restore) the first additional parity 'P''' corresponding to the codeword 'C' from the decoded sub-codeword 'Csub' or 'CSsub' and provide the extracted (or restored) first additional parity 'P''' to the additional syndrome generator 220b.

The second additional parity generator 220a may generate the second additional parity 'Q'' based on the extended rows 'Hext' extending from the first parity check matrix 'H1' and the read vector 'R' corresponding to the codeword 'C.' The second additional parity generator 220a may provide the generated second additional parity 'Q'' to the additional syndrome generator 220b.

The additional syndrome generator 220b may convert the first additional parity 'P''' consisting of binary elements received from the first syndrome checker 210a into the first additional parity 'P'' consisting of the elements of $GF(2^m)$. The additional syndrome generator 220b may generate the additional syndrome 'Sa' based on the first additional parity 'P'' including the elements of $GF(2^m)$ and the second additional parity 'Q'' received from the second additional parity generator 220a. For example, the additional syndrome generator 220b may generate the additional syndrome 'Sa' by performing an XOR operation on the first additional parity 'P'' and the second additional parity 'Q'.' The additional syndrome generator 220b may provide the generated additional syndrome 'Sa' to the syndrome combiner 220c.

The syndrome combiner 220c may generate the extended syndrome vector 'Sext' by combining the first syndrome vector 'S1' received from the first syndrome checker 210a and the additional syndrome 'Sa' received from the extended syndrome vector generator 220. The extended syndrome vector generator 220 may provide the extended syndrome vector 'Sext' to the key equation calculator 210b.

The key equation calculator 210b may generate an error location polynomial based on the extended syndrome vector 'Sext' received from the extended syndrome vector generator 220. The key equation calculator 210b may provide the calculated error location polynomial to the error location searcher 210c.

The error location searcher 210c may calculate an error location based on the error location polynomial received from the key equation calculator 210b. The error location searcher 210c may provide the calculated error location to the error corrector 210d.

The error corrector 210d may perform error correction based on information about the error location received from the error location searcher 210c. The error corrector 210d may provide the error-corrected read vector 'R'" to the second syndrome checker 210e.

The second syndrome checker 210e may perform a fifth syndrome check based on the error-corrected read vector 'R'" and the second parity check matrix 'H2.' When the fifth syndrome check passes, the decoded codeword may be output. When the fifth syndrome check fails, a fail signal indicating that the second error correction decoding fails may be output.

Figure 7:
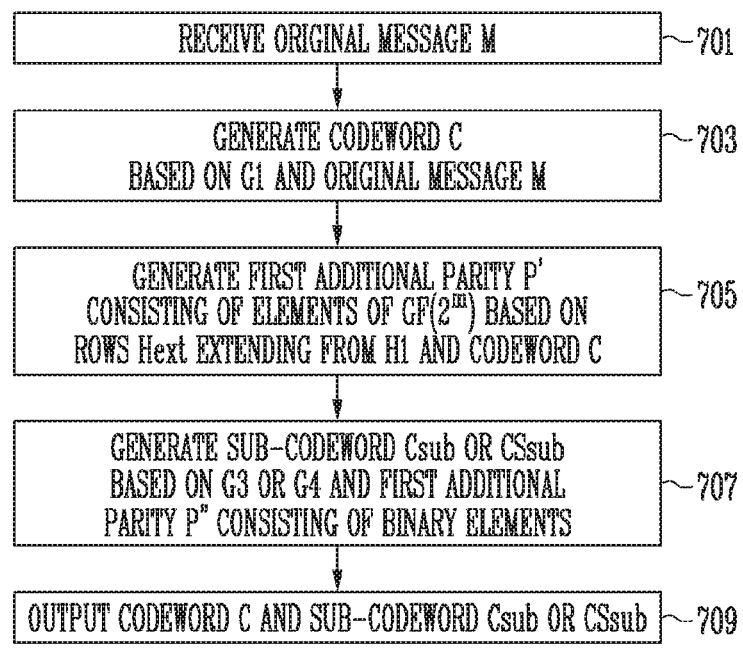
FIG. 7 is a flowchart illustrating error correction encoding performed by an error correction circuit shown in FIG. 6.

FIG. 7 is a flowchart illustrating error correction encoding performed by the error correction circuit 10 shown in FIG. 6.

At step 701, the error correction circuit 10 may receive an original message subject to error correction encoding from an external device.

At step 703, the error correction circuit 10 may generate the codeword 'C' based on the first generation matrix 'G1' and the original message. For example, the error correction circuit 10 may generate the codeword 'C' having n bits by performing first error correction encoding based on the first generation matrix 'G1' having a size of 'k×n' and the original message having k bits.

At step 705, the error correction circuit 10 may generate the first additional parity 'P'' consisting of the elements of $GF(2^m)$ based on the codeword 'C' and some rows of the second parity check matrix 'H2,' e.g., the extended rows 'Hext' from the first parity check matrix 'H1.' For example, the error correction circuit 10 may generate the first additional parity 'P'' including β elements of $GF(2^m)$ by performing product of the extended rows 'Hext' having a size of β×n and the codeword 'C' including the n bits.

At step 707, the error correction circuit 10 may generate the sub-codeword 'Csub' based on the third generation matrix 'G3' and the first additional parity 'P''' consisting of binary elements. The error correction circuit 10 may convert the first additional parity 'P'' consisting of the β elements of $GF(2^m)$ into the first additional parity 'P''' consisting of the binary elements of βm bits. According to an embodiment, whenever one first additional parity 'P''' corresponding to one codeword 'C' is generated, the error correction circuit 10 may generate the sub-codeword 'Csub' based on the third generation matrix 'G3' and one first additional parity 'P''.' According to an embodiment, whenever a plurality of first additional parities 'P''' corresponding to a plurality of codewords 'C' are generated, the error correction circuit 10 may generate the sub-codeword CSsub' based on the fourth generation matrix G4' and the plurality of first additional parities 'P''.'

At step 709, the error correction circuit 10 may output the codeword 'C' and the sub-codeword 'Csub' or 'CSsub' to the channel.

Figure 8:
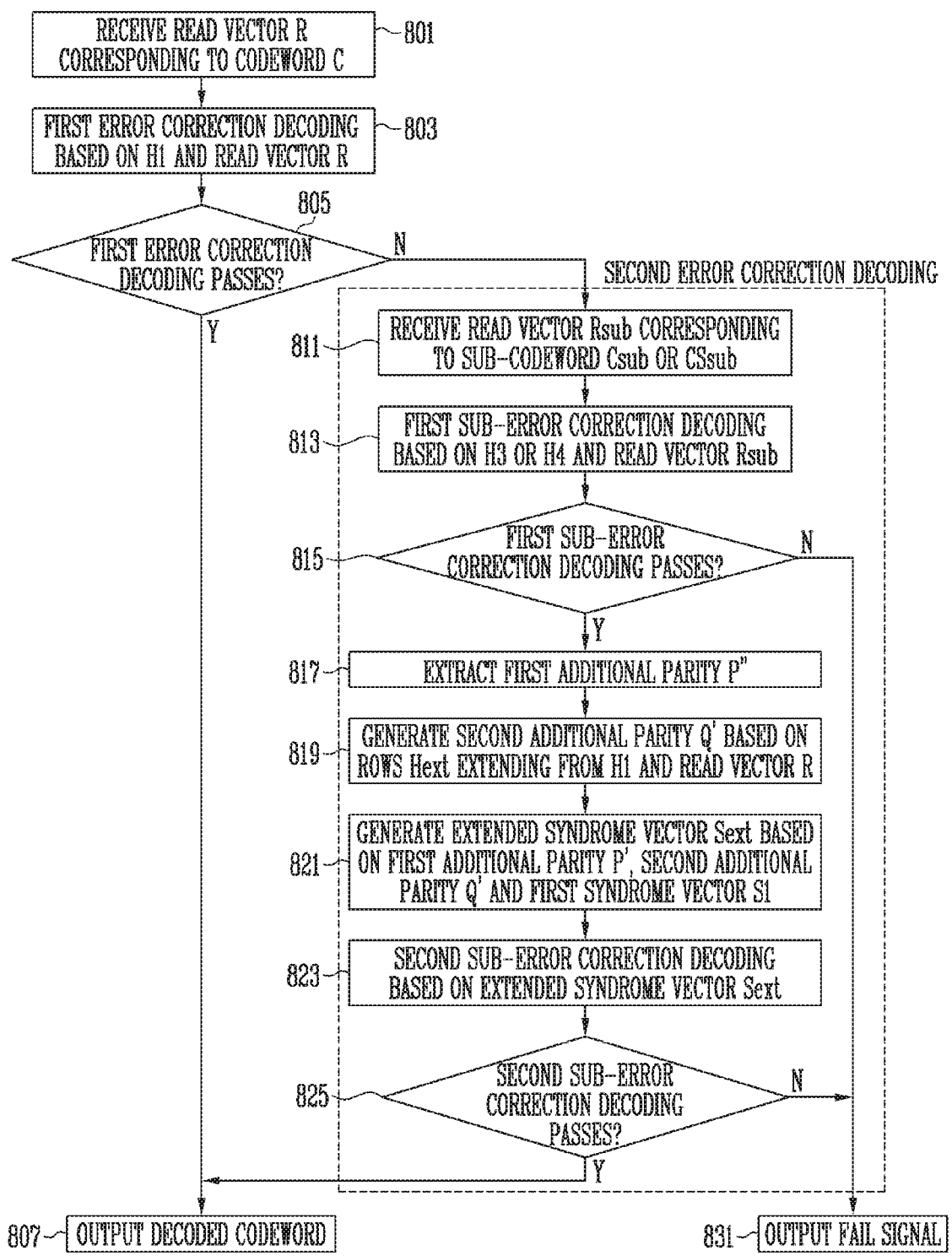
FIG. 8 is a flowchart illustrating error correction decoding performed by an error correction circuit shown in FIG. 6.

FIG. 8 is a flowchart illustrating error correction decoding by the error correction circuit 10 shown in FIG. 6.

At step 801, the error correction circuit 10 may receive the read vector 'R' corresponding to the codeword 'C.'

At step 803, the error correction circuit 10 may perform first error correction decoding based on the read vector 'R' and the first parity check matrix H1 corresponding to the first error correction capability. For example, the error correction circuit 10 may perform a first syndrome check based on the first parity check matrix H1 and the read vector 'R.' When the first syndrome check fails, the error correction circuit 10 may perform error location polynomial generation, error location search and error correction. The error correction circuit 10 may perform a second syndrome check based on the first parity check matrix 'H1' and the error-corrected read vector 'R'.'

At step 805, the error correction circuit 10 may determine whether the first error correction decoding has passed or not. When all elements of the first syndrome vector 'S1' generated during the first syndrome check are 'zero (0),' or when all elements of a second syndrome vector generated during the second syndrome check are '0,' it may be determined that the first error correction decoding passes. When at least one of the elements of the second syndrome vector generated during the second syndrome check is not '0,' it may be determined that the first error correction decoding fails.

When the first error correction decoding passes (Y), the decoded codeword may be output at step 807.

When the first error correction decoding fails (N), second error correction decoding may be performed at steps 811 to 825.

At step 811, the error correction circuit 10 may receive the read vector 'Rsub' corresponding to the sub-codeword 'Csub' or 'CSsub.'

At step 813, the error correction circuit 10 may perform first sub-error correction decoding based on the third parity check matrix 'H3' and the read vector 'Rsub' corresponding to the sub-codeword 'Csub,' or based on the fourth parity check matrix 'H4' and the read vector 'Rsub' corresponding to the sub-codeword 'CSsub.' For example, the error correction circuit 10 may perform a third syndrome check based on the third parity check matrix 'H3' and the read vector 'Rsub' corresponding to the sub-codeword 'Csub,' or based on the fourth parity check matrix 'H4' and the read vector 'Rsub' corresponding to the sub-codeword 'CSsub.' When the third syndrome check fails, the error correction circuit 10 may perform error location polynomial generation, error location search and error correction. The error correction circuit 10 may perform a fourth syndrome check based on the third parity check matrix 'H3' or the fourth parity check matrix 'H4' and the error-corrected read vector 'Rsub'.'

At step 815, the error correction circuit 10 may determine whether the first sub-error correction decoding has passed or not. When all elements of a third syndrome vector generated during the third syndrome check are 'zero (0),' or when all elements of a fourth syndrome vector generated during the fourth syndrome check are '0,' it may be determined that the first sub-error correction decoding has passed. When at least one of the elements of the fourth syndrome vector generated during the fourth syndrome check is not '0,' it may be determined that the first sub-error correction decoding has failed.

When the first sub-error correction decoding passes, step 817 may be performed.

When the first sub-error correction decoding fails (N), a fail signal indicating that the second error correction decoding fails may be output at step 831.

At step 817, the error correction circuit 10 may extract (or restore) the first additional parity 'P''' consisting of binary elements from the decoded sub-codeword 'Csub' or 'CSsub.'

At step 819, the error correction circuit 10 may generate the second additional parity 'Q'' based on the extended rows 'Hext' extending from the first parity check matrix 'H1' and the read vector 'R' corresponding to the codeword 'C.'

At step 821, the error correction circuit 10 may generate the extended syndrome vector 'Sext' based on the first additional parity 'P'' consisting of the elements of $GF(2^m)$, the second additional parity 'Q',' and the first syndrome vector 'S1.' The error correction circuit 10 may convert the first additional parity 'P''' consisting of the binary elements into the first additional parity 'P'' consisting of the elements of $GF(2^m)$ and perform an XOR operation on the converted first additional parity 'P"' and the second additional parity 'Q"' to generate the additional syndrome 'Sa.' In addition, the error correction circuit 10 may combine the first syndrome vector 'S1' and the additional syndrome 'Sa' to generate the extended syndrome vector 'Sext.'

At step 823, the error correction circuit 10 may perform second sub-error correction decoding based on the extended syndrome vector 'Sext'. For example, the error correction circuit 10 may perform error location polynomial generation, error location search and error correction based on the extended syndrome vector 'Sext'. The error correction circuit 10 may perform a fifth syndrome check based on the second parity check matrix 'H2' and the error-corrected read vector 'R".'

At step 825, the error correction circuit 10 may determine whether the second sub-error correction decoding has passed or not. When all elements of the fifth syndrome vector generated during the fifth syndrome check are 'zero (0),' it may be determined that the second sub-error correction decoding has passed. When at least one of the elements of the fifth syndrome vector generated during the fifth syndrome check is not '0,' it may be determined that the second sub-error correction decoding has failed.

When the second error correction decoding passes (Y), the decoded codeword may be output at step 807.

When the second sub-error correction decoding fails (N), a fail signal indicating that the second error correction decoding fails may be output at step 831.

Figure 9:
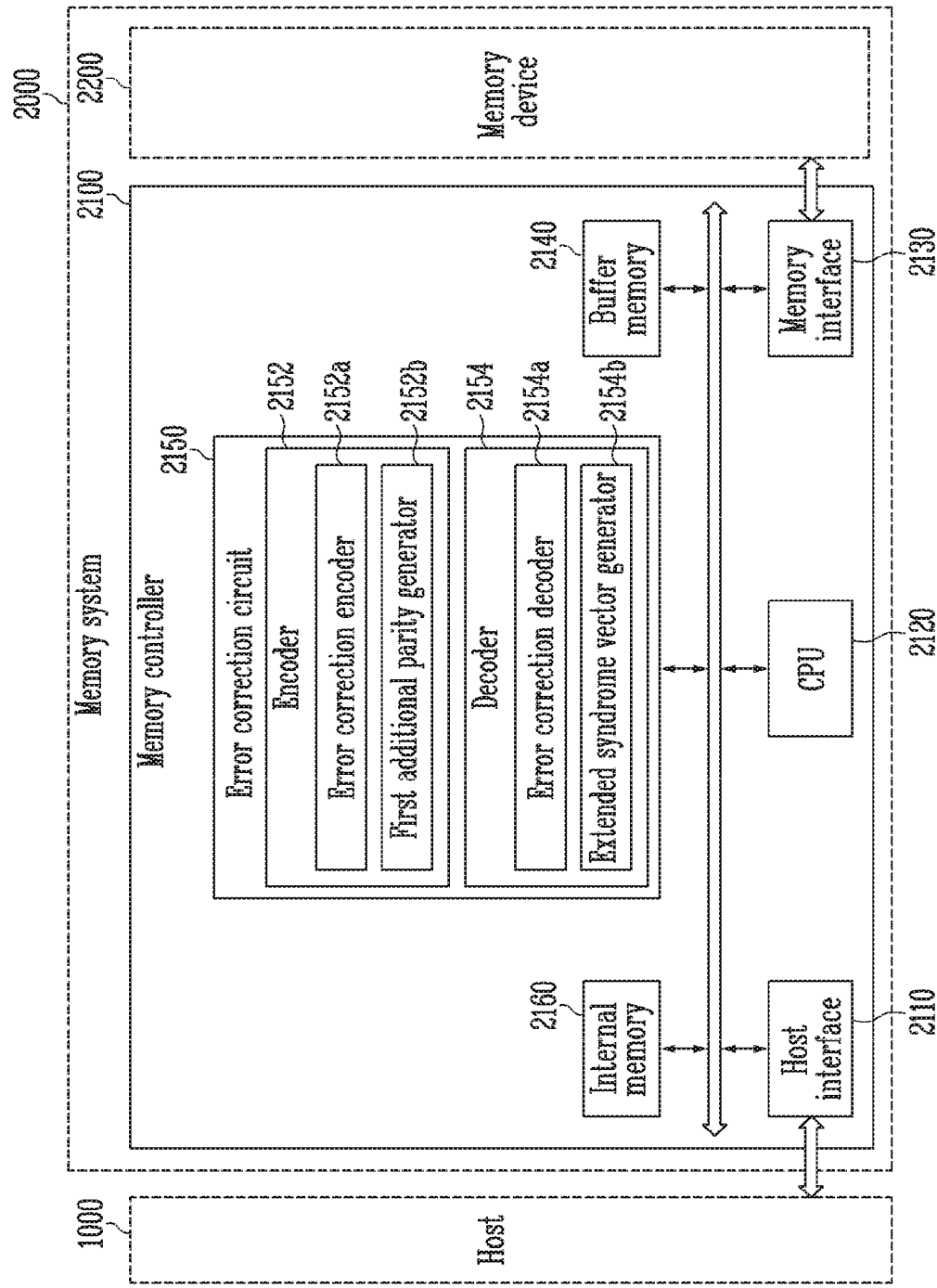
FIG. 9 is a diagram illustrating a memory system according to an embodiment of the disclosed technology.

FIG. 9 is a diagram illustrating a memory system 2000 according to an embodiment of the disclosed technology.

Referring to FIG. 9, the memory system 2000 may include a memory device 2200 configured to store data and a memory controller 2100 configured to control the memory device 2200 in response to a request from a host 1000.

The host 1000 may be a device or system configured to store data in the memory system 2000 or retrieve data from the memory system 2000. By way of example and not by limitation, the host 1000 may include at least one of a computer, a portable digital device, a tablet, a digital camera, a digital audio player, a television, a wireless communication device, or a cellular phone.

The memory controller 2100 may control overall operations of the memory system 2000. The memory controller 2100 may perform various operations in response to a request from the host 1000. For example, the memory controller 2100 may perform a program operation, a read operation, and an erase operation on the memory device 2200. In the program operation, the memory controller 2100 may transmit a program command, an address, a codeword, or others to the memory device 2200. In the read operation, the memory controller 2100 may transmit a read command, an address, or others to the memory device 2200, and receive read data corresponding to the codeword from the memory device 2200. In the erase operation, the memory controller 2100 may transmit an erase command, an address, or others to the memory device 2200.

The memory controller 2100 may include a host interface 2110, a central processing unit (CPU) 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the CPU 2120.

The host interface 2110 may perform communication with the host 1000 by using interface protocols. For example, the host interface 2110 may communicate with the host 1000 by using at least one interface protocol among a Non-Volatile Memory express (NVMe), a Peripheral Component Interconnect-Express (PCI-E), an Advanced Technology Attachment (ATA), a Serial ATA (SATA), a Parallel ATA (PATA), a Universal Serial Bus (USB), a Multi-Media Card (MMC), an Enhanced Small Disk Interface (ESDI), an Integrated Drive Electronics (IDE), a Mobile Industry Processor Interface (MIPI), a Universal Flash Storage (UFS), a Small Computer System Interface (SCSI), or a Serial Attached SCSI (SAS). However, embodiments of the disclosed technology are not limited thereto.

The CPU 2120 may perform various calculations or generate a command and an address so as to control the memory device 2200. For example, the CPU 2120 may generate various commands and addresses necessary for a program operation, a read operation, an erase operation, and others, in response to a request transferred from the host interface 2110.

The CPU 2120 may control the error correction circuit 2150 to perform error correction encoding on a message when the host 1000 requests to program the message. The CPU 2120 may determine a physical address for storing each of the codeword 'C' and the sub-codeword 'Csub' or 'CSsub' and generate a command and an address to the memory device 2200 so that each of the codeword 'C' and the sub-codeword 'Csub' or 'CSsub' may be stored in each of the storage areas corresponding to the determined physical address.

When a partial program method is used, whenever the first additional parity 'P"' consisting of binary elements corresponding to one codeword 'C' is generated, the CPU 2120 may control the error correction circuit 2150 to generate the sub-codeword 'Csub' corresponding to the first additional parity 'P",' and may generate and output a command and an address for storing the sub-codeword 'Csub' to the memory device 2200.

When the partial program method is not used, whenever a plurality of first additional parities 'P"' consisting of binary elements corresponding to a predetermined number of codewords 'C' are generated, the CPU 2120 may control the error correction circuit 2150 to generate the sub-codeword 'CSsub' corresponding to the plurality of first additional parities 'P",' and may generate and output a command and an address for storing the sub-codeword 'CSsub' to the memory device 2200.

The CPU 2120 may determine a physical address so that the codeword 'C' and the sub-codeword 'Csub' or 'CSsub' may be stored in different storage areas. For example, the CPU 2120 may determine to store the codeword 'C' in a first page of a first memory block and the sub-codeword 'Csub' or 'CSsub' in a second page of the first memory block. According to an embodiment, the CPU 2120 may determine a physical address so that the codeword 'C' and the sub-codeword 'Csub' or 'CSsub' may be stored in different memory blocks.

The CPU 2120 may manage a logical to physical (L2P) table where a physical address at which the codeword 'C' is stored and a logical address received from the host 1000 are mapped. The CPU 2120 may update the L2P table according to the physical address at which the codeword 'C' is stored.

The CPU 2120 may manage a codeword table which is mapping information about mapping between the physical address at which the codeword 'C' is stored and the physical address at which the sub-codeword 'Csub' or 'CSsub' corresponding to the codeword 'C' is stored. The CPU 2120 may update the codeword table according to the physical address at which the sub-codeword 'Csub' or 'CSsub' corresponding to the codeword 'C' is stored.

When the CPU 2120 receives a read request corresponding to a predetermined logical address from the host 1000, the CPU 2120 may check a physical address corresponding to the predetermined logical address in response to the read request with reference to the L2P table, and generate and output a command and an address for reading the codeword 'C' from a storage area corresponding to the checked physical address to the memory device 2200.

When the error correction circuit 2150 notifies that the first error correction decoding fails, the CPU 2120 may generate and output a command and an address for reading the sub-codeword 'Csub' or 'CSsub' corresponding to the codeword 'C' to the memory device 2200. The CPU 2120 may check the physical address at which the sub-codeword 'Csub' or 'CSsub' corresponding to the codeword 'C' is stored with reference to the codeword table.

When the error correction circuit 2150 notifies that the first error correction decoding or the second error correction decoding is successful, the CPU 2120 may control the buffer memory 2140 so that the decoded codeword may be transferred to the host 1000.

The memory interface 2130 may perform communication with the memory device 2200 by using various interface protocols.

The buffer memory 2140 may temporarily store data while the memory controller 2100 controls the memory device 2200. For example, the data received from the host 1000 may be temporarily stored in the buffer memory 2140 until a program operation is completed. Further, during the read operation, data read from the memory device 2200 may also be temporarily stored in the buffer memory 2140.

In addition, the buffer memory 2140 may receive the encoded codeword 'C' and sub-codeword 'Csub' or 'CSsub' from the error correction circuit 2150 and may temporarily store the codeword 'C' and the sub-codeword 'Csub' or 'CSsub' until they are transferred to the memory device 2200. The buffer memory 2140 may receive the decoded codeword 'C' from the error correction circuit 2150 and temporarily store the decoded codeword 'C' until it is transferred to the host 1000.

The error correction circuit 2150 may perform error correction encoding during a program operation and perform error correction decoding during a read operation. The error correction circuit 2150 may be an error correction circuit using a BCH code. The error correction circuit 2150 may include an encoder 2152 and a decoder 2154.

The encoder 2152 may perform error correction encoding on an original message received from the host 1000. The encoder 2152 may include an error correction encoder 2152a and a first additional parity generator 2152b. The basic configuration and operation of the encoder 2152 may be the same as the encoder 100 described with reference to FIG. 6. In other words, the error correction encoder 2152a and the first additional parity generator 2152b as illustrated in FIG. 9 may perform the same operations as the error correction encoder 110 and the first additional parity generator 120 as illustrated in FIG. 6.

The encoder 2152 may output the encoded codeword 'C' and sub-codeword 'Csub' or 'CSsub' to the buffer memory 2140 and notify the CPU 2120 that the encoded codeword 'C' and the sub-codeword 'Csub' or 'CSsub' are generated.

The decoder 2154 may perform error correction decoding using a read vector received from the memory device 2200. The decoder 2154 may include an error correction decoder 2154a and an extended syndrome vector generator 2154b. The basic configuration and operation of the decoder 2154 may be the same as the decoder 200 described with reference to FIG. 6. The error correction decoder 2154a and the extended syndrome vector generator 2154b as illustrated in FIG. 9 may perform the same operations as the error correction decoder 210 and the extended syndrome vector generator 220 as illustrated in FIG. 6.

The decoder 2154 may perform first error correction decoding with a first error correction capability when receiving the read vector 'R' corresponding to the codeword 'C' from the memory device 2200. When the first error correction decoding fails, the decoder 2154 may notify the CPU 2120 that the first error correction decoding fails.

The decoder 2154 may perform second error correction decoding with a second error correction capability when receiving the read vector 'Rsub' corresponding to the sub-codeword 'Csub' or 'CSsub' from the memory device 2200. When the second error correction decoding fails, the decoder 2154 may notify the CPU 2120 that the second error correction decoding fails.

The decoder 2154 may output the decoded codeword 'C' to the buffer memory 2140 and notify the CPU 2120 that the error correction decoding is successful when the first error correction decoding or the second error correction decoding passes.

The internal memory 2160 may be used as a storage where various information necessary for an operation of the memory controller 2100 is stored. The internal memory 2160 may store a plurality of tables. In an embodiment, the internal memory 2160 may store an L2P table including mapping information between logical and physical addresses. In an embodiment, the internal memory 2160 may store a codeword table.

The memory controller 2100 controls the operations of the memory device 2200, which include a program operation, a read operation, an erase operation, and others. The memory device 2200 may be a volatile memory device losing stored data when power supply is blocked, or a non-volatile memory device maintaining the stored data even in the absence of power supply.

The memory device 2200 may receive a program command, an address, and a codeword from the memory controller 2100, and store the codeword according to the received program command and address.

The memory device 2200 may include a plurality of memory blocks, each of which may include a plurality of pages. Each of the pages may include a plurality of chunks. One page or one chunk may include a plurality of write units.

The memory device 2200 may receive a command, an address, codeword 'C' and sub-codeword 'Csub' or 'CSsub' from the memory controller 2100. The memory device 2200 may store the codeword 'C' and the sub-codeword 'Csub' or 'CSsub' according to the command and the address received from the memory controller 2100. For example, the memory device 2200 may store the codeword 'C' and the sub-codeword 'Csub' or 'CSsub' in different storage areas. For example, the memory device 2200 may store the codeword 'C' and the sub-codeword 'Csub' or 'CSsub' in different chunks, different pages, or different memory blocks.

The memory device 2200 may use a partial program method when storing the sub-codeword 'Csub.' For example, the memory device 2200 may store the sub-codeword 'Csub' in one program unit whenever the memory device 2200 receives one sub-codeword 'Csub' from the memory controller 2100. The sub-codeword 'Csub' may be received along with or separately from the codeword 'C.'

The memory device 2200 may perform a read operation on the codeword 'C' and the sub-codeword 'Csub' or 'CSsub' according to the command and the address received from the memory controller 2100. The memory device 2200 may provide the memory controller 2100 with the read vector 'R' corresponding to the codeword 'C' or the read vector 'Rsub' corresponding to the sub-codeword 'Csub' or 'CSsub.'

Figure 10:
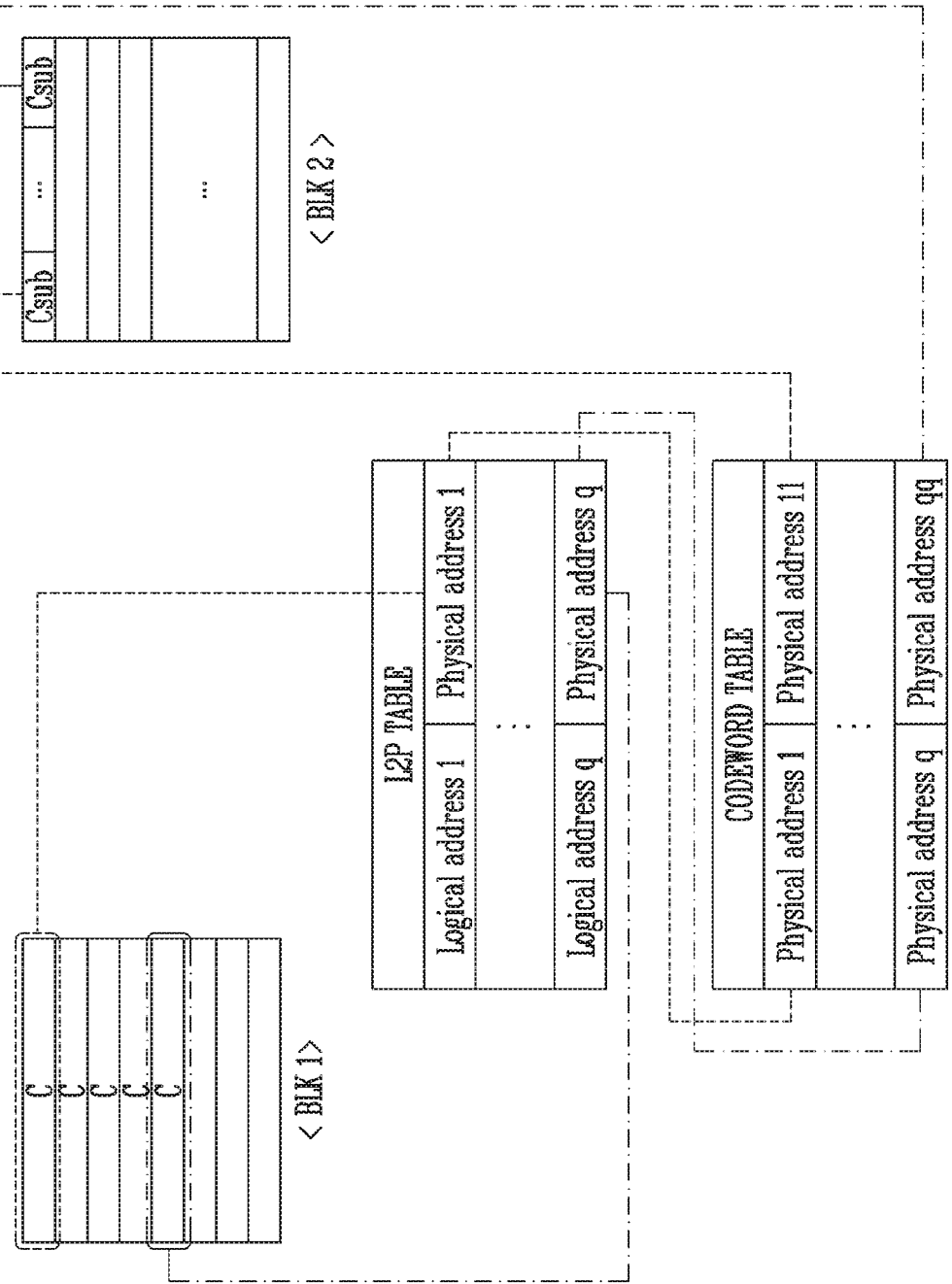
FIG. 10 is a diagram illustrating a codeword table according to an embodiment of the disclosed technology.

FIG. 10 is a diagram illustrating a codeword table according to an embodiment of the disclosed technology.

FIG. 10 illustrates an example in which the sub-codeword 'Csub' corresponding to one first additional parity 'P''' is generated whenever the first additional parity 'P''' corresponding to one codeword 'C' is generated. The same principle is applicable to a case in which the sub-codeword 'CSsub' is generated corresponding to a plurality of first additional parities 'P''.'

FIG. 10 illustrates an example in which the codewords 'C' are stored in pages corresponding to a physical address 1 to a physical address 'q.'

In this example, an L2P table may store mapping information between a logical address and a physical address corresponding to each of the codewords 'C.' In the example as shown in FIG. 10, the physical address 1 may be mapped to a logical address 1 and the physical address 'q' may be mapped to a logical address 'q.'

The codeword table may store mapping information between a physical address (or a logical address according to an embodiment) corresponding to a storage area where the codeword 'C' is stored and a physical address corresponding to a storage area where the sub-codeword 'Csub' corresponding to the codeword 'C.' In the example shown in FIG. 10, the physical addresses 1 to 'q' corresponding to storage areas at which a plurality of codewords 'C' are stored may be mapped to physical addresses 11 to 'qq' corresponding to storage areas at which the sub-codewords Csub are stored.

Therefore, when first error correction decoding using the read vector 'R' corresponding to the codeword 'C' fails, the physical address corresponding to a storage area where the sub-codeword 'Csub' corresponding to the codeword 'C' is stored may be obtained based on the codeword table. In addition, the sub-codeword 'Csub' may be read from the storage area corresponding to the obtained physical address.

Although FIG. 10 illustrates the case in which the codewords 'C' and the sub-codewords 'Csub' are stored in the different memory blocks 'BLK 1' and 'BLK 2.' However, embodiments of the disclosed technology are not limited thereto. For example, the codewords C and the sub-codewords Csub may be stored in the same memory block.

Figure 11:
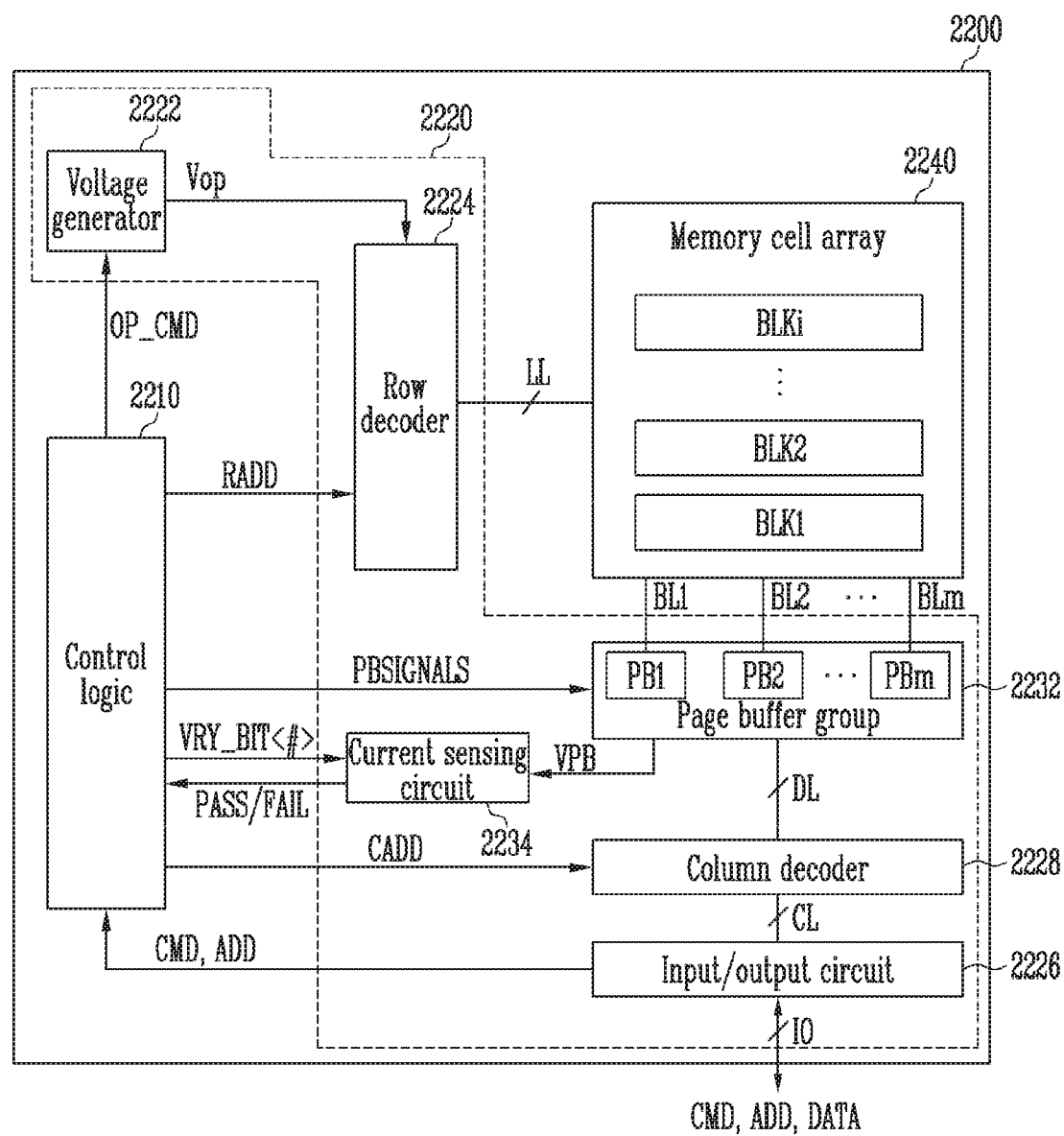
FIG. 11 is a diagram illustrating a memory device according to an embodiment of the disclosed technology.

FIG. 11 is a diagram illustrating the memory device 2200 according to an embodiment of the disclosed technology. The memory device 2200 illustrated in FIG. 11 may be applied to the memory system of FIG. 9.

The memory device 2200 may include a control logic 2210, peripheral circuits 2220, and a memory cell array 2240. The peripheral circuits 2220 may include a voltage generator 2222, a row decoder 2224, an input/output circuit 2226, a column decoder 2228, a page buffer group 2232, and a current sensing circuit 2234.

The control logic 2210 may control the peripheral circuits 2220 under the control of the memory controller 2100 shown in FIG. 9. The control logic 2210 may control the peripheral circuits 2220 in response to a command 'CMD' and an address 'ADD' that are received from the memory controller 2100 through the input/output circuit 2226. For example, the control logic 2210 may output an operation signal 'OP_CMD,' a row address 'RADD,' a column address 'CADD,' page buffer control signals 'PBSIGNALS,' and an allow bit 'VRY_BIT<#>' in response to the command 'CMD' and the address "ADD.' The control logic 2210 may determine whether a verify operation has passed or failed in response to a pass or fail signal 'PASS' or 'FAIL' received from the current sensing circuit 2234.

The peripheral circuits 2220 may perform a selective erase operation to erase selected memory cells, among memory cells included in a selected memory block, in response to control of the control logic 2210. The peripheral circuits 2220 may perform a program operation for storing data in the memory cell array 2240, a read operation for outputting data stored in the memory cell array 2240, and an erase operation for erasing data stored in the memory cell array 2240.

The voltage generator 2222 may generate various operating voltages Vop used in the program, read, and erase operations in response to the operation signal 'OP_CMD' received from the control logic 2210. For example, the voltage generator 2222 may transfer a program voltage, a verify voltage, a pass voltage, a read voltage, an erase voltage, a turn-on voltage, etc. to the row decoder 2224.

The row decoder 2224 may transfer the operating voltages Vop to local lines 'LL' coupled to a selected memory block, among memory blocks included in the memory cell array 2240, in response to the row address 'RADD' received from the control logic 2210. The local lines 'LL' may include local word lines, local drain select lines, and local source select lines. In addition, the local lines 'LL' may include various lines coupled to a memory block, such as a source line.

The input/output circuit 2226 may transfer the command 'CMD' and the address 'ADD,' which are received from the memory controller 2100, to the control logic 2210 through input/output lines 'IO,' or may exchange data 'DATA' with the column decoder 2228.

The column decoder 2228 may transfer data between the input/output circuit 2226 and the page buffer group 2232 in response to a column address 'CADD' received from the control logic 2210. For example, the column decoder 2228 may exchange data with page buffers 'PB1' to 'PBm' through data lines 'DL,' or may exchange data with the input/output circuit 2226 through column lines 'CL.'

The page buffer group 2232 may be coupled to bit lines 'BL1' to 'BLm' coupled in common to memory blocks 'BLK1' to 'BLKi.' The page buffer group 2232 may include a plurality of page buffers 'PB1' to 'PBm' coupled to the bit lines 'BL1' to 'BLm,' respectively. For example, a single page buffer may be coupled to each bit line. The page buffers 'PB1' to 'PBm' may operate in response to the page buffer control signals 'PBSIGNALS' received from the control logic 2210. For example, the page buffers 'PB1' to 'PBm' may temporarily store program data received from the memory controller 2100 during a program operation and may control voltages applied to the bit lines 'BL1' to 'BLm' according to the program data. Also, during a read operation, the page buffers 'PB1' to 'PBm' may temporarily store data received through the bit lines 'BL1' to 'BLm' or may sense voltages or currents of the bit lines 'BL1' to 'BLm.'

During a read or verify operation, the current sensing circuit 2234 may generate a reference current in response to the allow bit 'VRY_BIT<#>' received from the control logic 2210, and may output the pass signal 'PASS' or the fail signal 'PASS' or 'FAIL' by comparing a sensing voltage 'VPB' received from the page buffer group 2232 with a reference voltage generated by the reference current.

The memory cell array 2240 may include the plurality of memory blocks 'BLK1' to 'BLKi' in which data is stored. The memory blocks 'BLK1' to 'BLKi' may store user data and various types of information for performing the operations of the memory device 2200. The memory blocks 'BLK1' to 'BLKi' may have a two-dimensional structure or a three-dimensional structure, and may have the same configuration.

Figure 12:
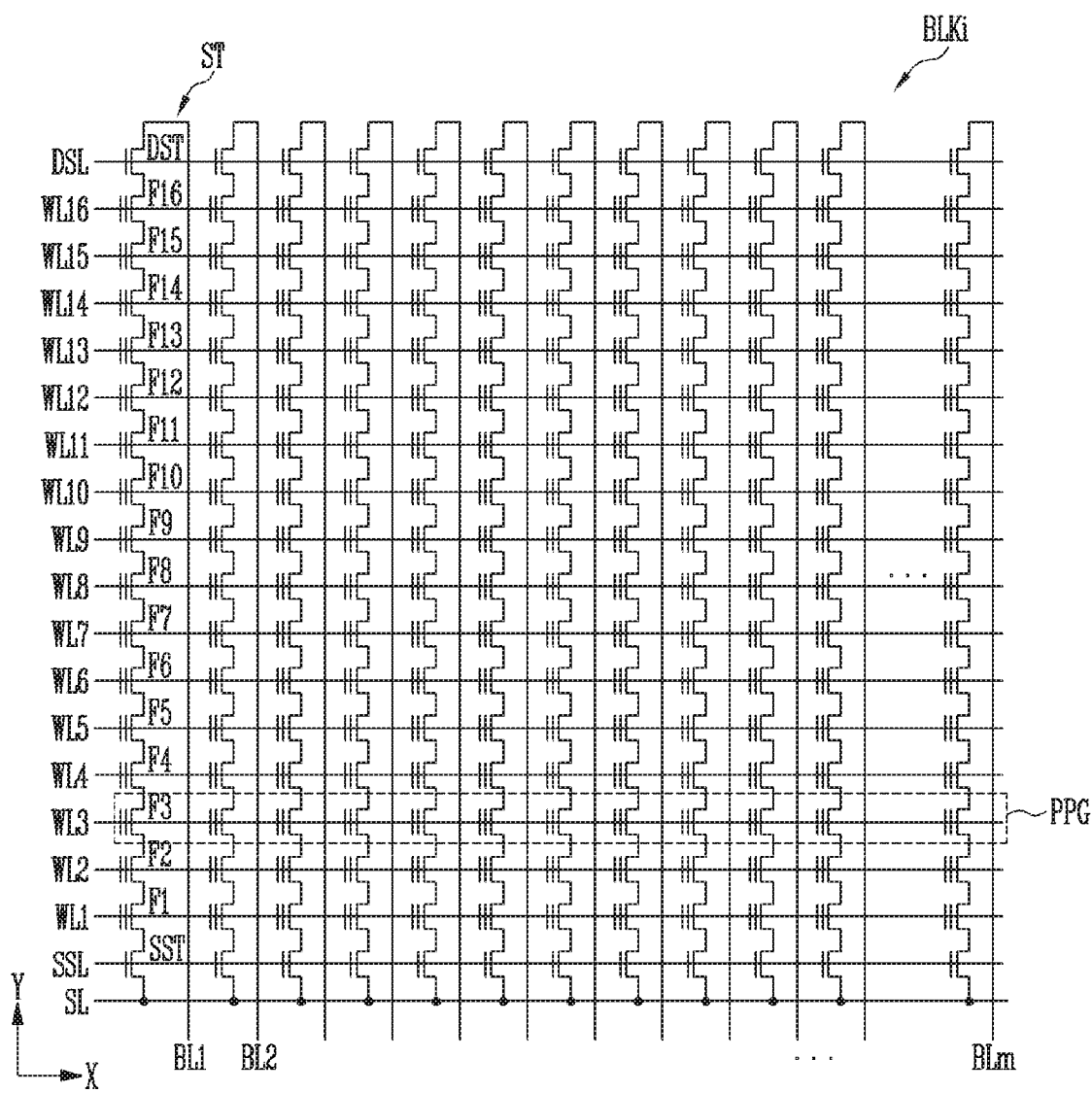
FIG. 12 is a diagram illustrating an example of a memory block.

FIG. 12 is a diagram illustrating an example of a memory block.

Referring to FIG. 12, the memory block 'BLKi' may be configured such that a plurality of word lines arranged in parallel may be coupled between a first select line and a second select line. The first select line may be a source select line 'SSL' and the second select line may be a drain select line 'DSL.' Specifically, the memory block 'BLKi' may include a plurality of strings 'ST' coupled between bit lines 'BL1' to 'BLm' and a source line 'SL.' The bit lines 'BL1' to 'BLm' may be coupled to the strings 'ST,' respectively, and the source line 'SL' may be coupled in common to the strings 'ST.' Since the strings 'ST' may have the same configuration, the string 'ST' coupled to the first bit line 'BL1' will be described in detail as an example.

The string 'ST' may include a source select transistor 'SST,' a plurality of memory cells 'F1' to 'F16,' and a drain select transistor 'DST' which are coupled in series to each other between the source line 'SL' and the first bit line 'BL1.' Each string 'ST' may include at least one source select transistor SST, at least one drain select transistors 'DST,' and more memory cells than the memory cells 'F1' to 'F16' as shown in FIG. 12.

A source of the source select transistor 'SST' may be coupled to the source line 'SL,' and a drain of the drain select transistor 'DST' may be coupled to the first bit line 'BL1.' The memory cells 'F1' to 'F16' may be coupled in series between the source select transistor 'SST' and the drain select transistor 'DST.' Gates of the source select transistors 'SST' included in different strings 'ST' may be coupled to the source select line 'SSL,' gates of the drain select transistors 'DST' included in different strings 'ST' may be coupled to the drain select line 'DSL,' and gates of the memory cells 'F1' to 'F16' may be coupled to a plurality of word lines 'WL1' to 'WL16,' respectively. A group of memory cells coupled to the same word line, among memory cells included in different strings 'ST,' may be referred to as a physical page 'PPG.' Therefore, the memory block 'BLKi' may include as many physical pages 'PPG' as the number of word lines 'WL1' to 'WL16.'

A single memory cell may store one bit of data. This memory cell may be called a single level cell (SLC). One physical page 'PPG' may store one logical page (LPG) data. Data of the single logical page 'LPG' may include as many data bits as the number of cells included in the single physical page PPG. For example, when two or more bits of data are stored in one memory cell, one physical page 'PPG' may store data corresponding to two or more logical pages 'LPG.' For example, in a memory device driven in a multi-level cell (MLC) type, data corresponding to the two logical pages 'LPG' may be stored in one physical page 'PPG,' and in a memory device driven in a triple level cell (TLC) type, data corresponding to three logical pages 'LPG' may be stored in one physical page 'PPG.'

Figure 13:
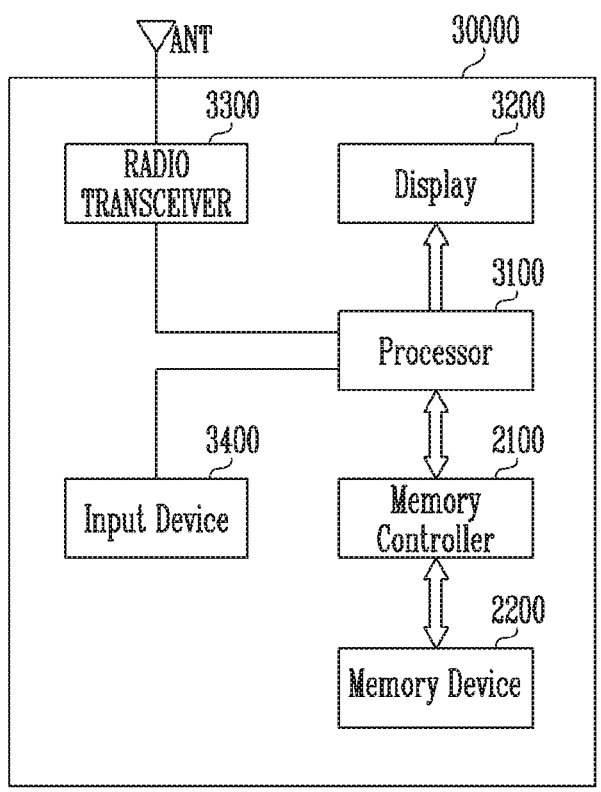
FIG. 13 is a diagram illustrating another embodiment of a memory system including a memory controller of FIG. 9.

FIG. 13 is a diagram illustrating another embodiment of a memory system 30000 including the memory controller 2100 of FIG. 9.

Referring to FIG. 13, the memory system 30000 may be embodied into a cellular phone, a smart phone, a tablet, a personal computer (PC), a personal digital assistant (PDA), or a wireless communication device. The memory system 30000 may include the memory device 2200 and the memory controller 2100 controlling the operations of the memory device 2200.

The memory controller 2100 may control an access operation of the memory device 2200, for example, a program operation, a read operation and an erase operation under the control of a processor 3100.

The memory controller 2100 may control data programmed into the memory device 2200 to be output through a display 3200.

A radio transceiver 3300 may exchange a radio signal through an antenna 'ANT.' For example, the radio transceiver 3300 may change the radio signal received through the antenna 'ANT' into a signal which can be processed by the processor 3100. Therefore, the processor 3100 may process the signal output from the radio transceiver 3300 and transfer the processed signal to the memory controller 2100 or the display 3200. The memory controller 2100 may program the signal processed by the processor 3100 into the semiconductor memory device 2200. In addition, the radio transceiver 3300 may change a signal output from the processor 3100 into a radio signal, and may output the radio signal to an external device through the antenna 'ANT.' A control signal for controlling the operations of the processor 3100 or data to be processed by the processor 3100 may be input by an input device 3400, and the input device 3400 may include a pointing device, such as a touch pad and a computer mouse, a keypad, or a keyboard. The processor 3100 may control the operation of the display 3200 such that data output from the memory controller 2100, data output from the radio transceiver 3300, or data output from the input device 3400 may be output through the display 3200.

According to an embodiment, the memory controller 2100 capable of controlling the operation of the memory device 2200 may be implemented as a part of the processor 3100 or as a chip provided separately from the processor 3100.

Figure 14:
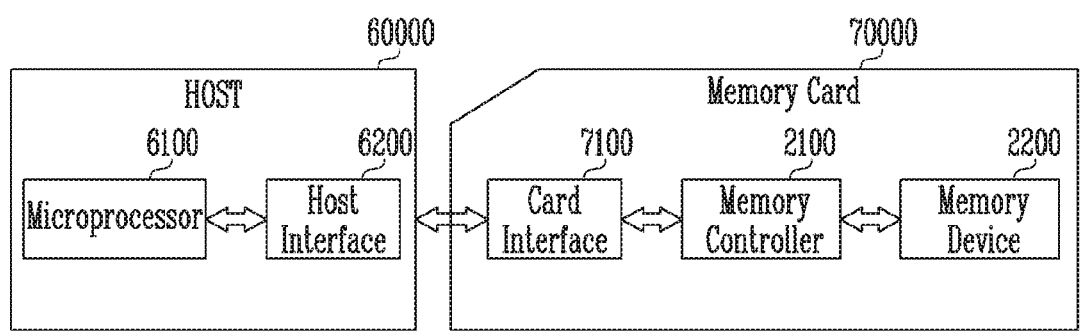
FIG. 14 is a diagram illustrating another embodiment of a memory system including a memory controller of FIG. 9.

FIG. 14 is a diagram illustrating another embodiment of a memory system 70000 including the memory controller 2100 of FIG. 9.

Referring to FIG. 14, the memory system 70000 may include a memory card or a smart card. The memory system 70000 may include the memory device 2200, the memory controller 2100, and a card interface 7100.

The memory controller 2100 may control data exchange between the memory device 2200 and the card interface 7100. According to an embodiment, the card interface 7100 may be, but not limited thereto, a secure digital (SD) card interface or a multi-media card (MMC) interface.

The card interface 7100 may interface data exchange between a host 60000 and the memory controller 2100 according to a protocol of the host 60000. According to an embodiment, the card interface 7100 may support a Universal Serial Bus (USB) protocol and an InterChip (IC)-USB protocol. The card interface 7100 may refer to hardware that supports a protocol used by the host 60000, software mounted on the hardware, or a signal transmission method.

When the memory system 70000 is connected to a host interface 6200 of the host 60000 such as a PC, a tablet, a digital camera, a digital audio player, a cellular phone, console video game hardware, or a digital set-top box, the host interface 6200 may perform data communication with the memory device 2200 through the card interface 7100 and the memory controller 2100 in response to control of a microprocessor 6100.

By implementing the technology disclosed in the disclosed technology, error correction capability of an error correction circuit using a BCH code may be varied.

What is claimed is:

1. A memory controller using a Bose-Chaudhuri-Hocquenghem (BCH) code, comprising:
   an encoder configured to generate a codeword using a message to be encoded and a first generation matrix and to generate a first additional parity using the codeword and one or more rows of a second parity check matrix; and
   a decoder configured to perform a first error correction decoding having a first error correction capability by using a first syndrome vector, and to perform a second error correction decoding having a second error correction capability by using the first syndrome vector and an additional syndrome vector,
   wherein the second error correction capability is higher than the first error correction capability,
   wherein the second parity check matrix includes the first parity check matrix and the one or more rows extended from the first parity check matrix,
   wherein the first syndrome vector is generated based on a read vector corresponding to the codeword and the first parity check matrix, and
   wherein the additional syndrome vector is generated based on the first additional parity.

2. The memory controller of claim 1, wherein the decoder is configured to perform the second error correction decoding in response to a failure of the first error correction decoding.

3. The memory controller of claim 1, wherein the decoder is configured to generate a second additional parity using the one or more rows of the second parity check matrix and the read vector, and to generate the additional syndrome vector by performing an exclusive OR operation on the first additional parity and the second additional parity during the second error correction decoding.

4. The memory controller of claim 3, wherein the decoder is configured to generate an extended syndrome vector by combining the first syndrome vector and the additional syndrome vector, and to generate an error location polynomial using the extended syndrome vector.

5. The memory controller of claim 1, wherein the encoder is configured to generate a sub-codeword based on the first additional parity and a third generation matrix, and
   wherein the decoder is configured to restore the first additional parity based on a third parity check matrix corresponding to the third generation matrix and a read vector corresponding to the sub-codeword.

6. The memory controller of claim 5, further comprising a central processing unit (CPU) configured to provide a memory device with commands to store the codeword and the sub-codeword in different storage areas.

7. The memory controller of claim 6, wherein the CPU is configured to provide the memory device with a physical address at which the sub-codeword is stored and a command to read the sub-codeword, in response to a failure of the first error correction decoding.

8. The memory controller of claim 6, wherein the CPU is configured to provide the memory device with, a command to store one or more sub-codewords and,
   wherein a total length of the one or more sub-codewords is same as a length of the codeword.

9. An error correction circuit using a Bose-Chaudhuri-Hocquenghem (BCH) code, comprising:
   an encoder configured to generate a codeword using a message to be encoded and a first generation matrix, and to generate a first additional parity using the codeword and one or more rows of a second parity check matrix; and
   a decoder configured to perform a first error correction decoding having a first error correction capability by using a first syndrome vector, and to perform a second error correction decoding having a second error correction capability by using the first syndrome vector and an additional syndrome vector,
   wherein the second error correction capability is higher than the first error correction capability,
   wherein the second parity check matrix includes the first parity check matrix and the one or more rows extended from the first parity check matrix,
   wherein the first syndrome vector is generated based on a read vector corresponding to the codeword and the first parity check matrix, and
   wherein the additional syndrome vector is generated based on the first additional parity.

10. The error correction circuit of claim 9, wherein the decoder is configured to perform the second error correction decoding in response to a failure of the first error correction decoding.

11. The error correction circuit of claim 9, wherein the decoder is configured to generate a second additional parity using the one or more rows of the second parity check matrix and the read vector, and to generate the additional syndrome vector by performing an exclusive OR operation on the first additional parity and the second additional parity during the second error correction decoding.

12. The error correction circuit of claim 11, wherein the decoder is configured to generate an extended syndrome vector by combining the first syndrome vector and the additional syndrome vector, and to generate an error location polynomial using the extended syndrome vector.

13. The error correction circuit of claim 9, wherein the second error correction decoding includes a first sub-error correction decoding and a second sub-error correction decoding, and
   wherein the decoder is configured to perform the first sub-error correction decoding to obtain the first additional parity, and to perform the second sub-error correction decoding based on the first syndrome vector and the additional syndrome vector.

14. The error correction circuit of claim 13, wherein the encoder is configured to generate a sub-codeword based on the first additional parity and a third generation matrix, and
   wherein the decoder is configured to restore the first additional parity based on a third parity check matrix corresponding to the third generation matrix and a read vector corresponding to the sub-codeword in the first sub-error correction decoding.

15. The error correction circuit of claim 13, wherein the encoder is configured to generate a multiple sub-codeword based on a plurality of first additional parities corresponding to a plurality of codewords and a fourth generation matrix, and
   wherein the decoder is configured to restore the plurality of first additional parities based on a fourth parity check matrix corresponding to the fourth generation matrix and a read vector corresponding to the multiple sub-codeword in the first sub-error correction decoding.

16. A memory system using a Bose-Chaudhuri-Hocquenghem (BCH) code, comprising:

a memory controller configured to generate a codeword by using a message to be encoded and a first generation matrix, generate a first additional parity by using the codeword and one or more rows of a second parity check matrix, and generate a sub-codeword by using the first additional parity and a third generation matrix; and a memory device configured to store the codeword and the sub-codeword received from the memory controller in different storage areas, wherein the second parity check matrix has a higher error correction capability than a first parity check matrix corresponding to the first generation matrix, and wherein the second parity check matrix includes the first parity check matrix and the one or more rows extended from the first parity check matrix.

17. The memory system of claim 16, wherein the memory controller is configured to perform a first error correction decoding by using a first syndrome vector, and to perform a second error correction decoding by using the first syndrome vector and an additional syndrome vector, wherein the first syndrome vector is generated based on a read vector corresponding to the codeword and the first parity check matrix, and wherein the additional syndrome is generated based on the first additional parity.

18. The memory system of claim 17, wherein the memory controller is configured to generate a second additional parity using the one or more rows of the second parity check matrix and the read vector, and to generate the additional syndrome vector by performing an exclusive OR operation on the first additional parity and the second additional parity.

19. The memory system of claim 18, wherein the second error correction decoding includes a first sub-error correction decoding and a second sub-error correction decoding, and wherein the memory controller is configured to perform the first sub-error correction decoding to obtain the first additional parity, and to perform the second sub-error correction decoding based on the first syndrome vector and the additional syndrome vector.

20. The memory system of claim 19, wherein the memory controller is configured to provide the memory device with a command to store the codeword in a first storage area and a command to store one or more sub-codewords in a second storage area different from the first storage area, and wherein a total length of the one or more sub-codewords is same as a length of the codeword.

* * * * *